US006318103B1

(12) United States Patent
Rieger et al.

(10) Patent No.: US 6,318,103 B1
(45) Date of Patent: Nov. 20, 2001

(54) EVAPORATOR MOUNTED BLOWER SPEED CONTROL

(75) Inventors: Yvonne D. Rieger, Benbrook, TX (US); William F. Rausch, Middleport, NY (US); Mark W. Stevenson, Appleton, NY (US); Chad S. Pinger, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/668,803

(22) Filed: Sep. 22, 2000

(51) Int. Cl.[7] .............................. F25D 23/12; H05K 7/20
(52) U.S. Cl. .......................... 62/259.2; 62/239; 361/715
(58) Field of Search .................... 62/259.2, 239, 62/244, 298; 361/688, 711, 714, 715, 716

(56) References Cited

U.S. PATENT DOCUMENTS

| 4,546,619 | * | 10/1985 | Rohner . | |
| 4,616,693 | * | 10/1986 | Dietzsch et al. | 62/259.2 X |
| 5,012,656 | * | 5/1991 | Tamura | 361/688 X |
| 5,058,391 | | 10/1991 | Périot | 62/238.6 |
| 5,220,809 | * | 6/1993 | Voss | 62/259.2 |
| 5,986,882 | * | 11/1999 | Ekrot et al. | 361/687 |

* cited by examiner

Primary Examiner—Henry Bennett
Assistant Examiner—Chen-Wen Jiang
(74) Attorney, Agent, or Firm—Patrick M. Griffin

(57) ABSTRACT

The present disclosure relates to electrical component heat dissipation and, more particularly, to a method and apparatus for dissipating heat from a power control module. In one embodiment the invention is a power control module having a housing and an electrical connection. A thermally conductive material is placed between the power control module and a surface of an evaporator core with a first side of the thermally conductive material in contact with the power control module and a second side in contact with the surface of the evaporator core. The thermally conductive material conducts heat from the power control module to the surface of the evaporator core.

26 Claims, 5 Drawing Sheets

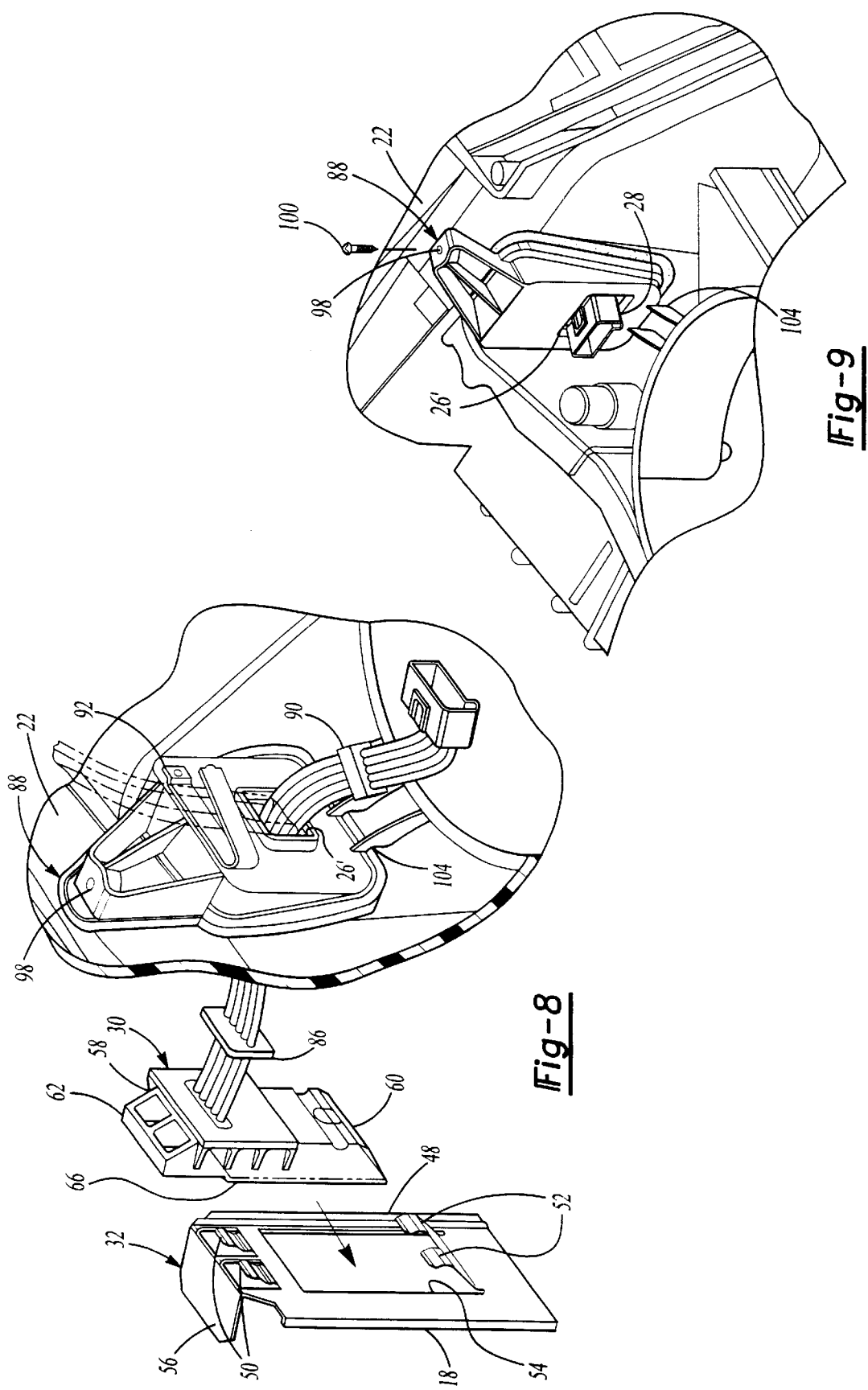

EVAPORATOR MOUNTED BLOWER SPEED CONTROL

TECHNICAL FIELD

The present invention relates to electrical component heat dissipation and, more particularly, to a method and apparatus for dissipating heat from a power control module.

BACKGROUND OF THE INVENTION

The heating, ventilation and air conditioning (HVAC) systems of a vehicle typically include a blower motor. Often these blower motors are direct current brushed blower motors. Additionally, the system includes a power control module such as a linear power module, a pulse width modulator, or a relay resistor module, all of which provide variable speed control of the blower motor. One difficulty associated with these power control modules is that they typically generate a significant amount of heat, which must be dissipated to preserve the life of the module. The traditional method for dissipating heat has required that a heat sink attached to the power control module be designed individually for each power control module design. In addition, it is typically required that the heat sink be inserted into the airflow of the HVAC system to cool the electronic components inside of the power control module. These specially designed heat sinks have generally been large and cumbersome and typically raise the cost of the power control module by at least 15%. The requirement that the heat sink be located within the airflow of the HVAC system negatively influences the system noise and airflow.

Thus, it would be beneficial to design an apparatus and develop a method for dissipating heat from power control modules that is relatively inexpensive, and does not negatively affect system noise or air flow.

SUMMARY OF THE INVENTION

In one embodiment, the present invention is a power control module comprising: a power control module having a housing and an electrical connection; a thermally conductive material having a first side in contact with the power control module and a second side in contact with a surface of an evaporator core; and the thermally conductive material conducting heat from the power control module to the surface of the evaporator core.

In another embodiment the present invention is a power control module comprising: a power control module having a housing and an electrical connection; a thermally conductive material having a first side connected to the power control module and a second side secured to a surface of an evaporator core; and the thermally conductive material conducting heat from the power control module to the surface of the evaporator core.

In yet another embodiment the present invention is a method for cooling a power control module comprising the steps of: providing a power control module having a housing and an electrical connection; providing a surface of an evaporator core; positioning a first side of a thermally conductive material against the power control module and positioning a second side of the thermally conductive material against the surface of the evaporator core; and conducting heat from the power control module through the thermally conductive material to the surface of the evaporator core.

BRIEF DESCRIPTION OF THE DRAWINGS

FIG. 8 is a partial exploded view of an alternative embodiment of a power control module; and FIG. 9 is a partial view of FIG. 7 after installation of a replacement power control module cover.

DESCRIPTION OF THE PREFERRED EMBODIMENT

Throughout the several views like components are assigned the same reference number.

Figure 1:
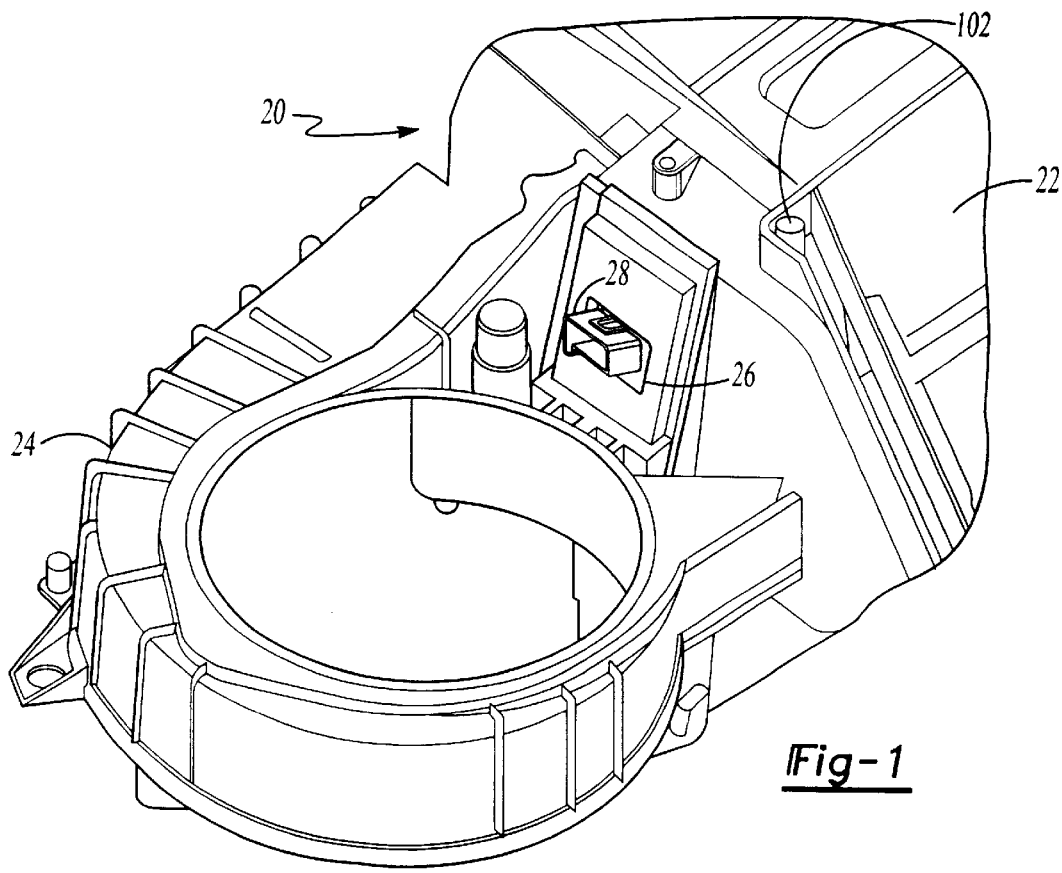
FIG. 1 is a partial view of a heating, ventilation, and air conditioning module of a vehicle designed according to the present invention.
Figure 3:
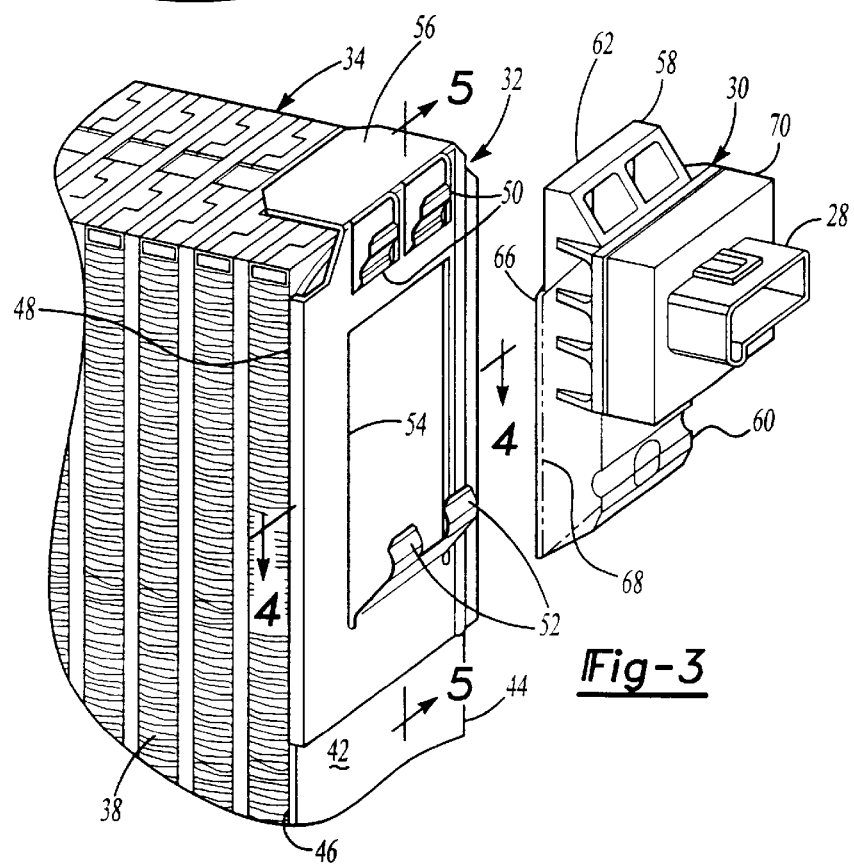
FIG. 3 is a side view of an evaporator core, mounting bracket, and a power control module designed according to the present invention.

A heating, ventilation, and air conditioning (HVAC) module is shown generally at 20 in FIG. 1. HVAC module 20 includes an outer housing 22 to which is attached a blower motor mount 24. Outer housing 22 includes an aperture 26 which provides access to an electrical connection 28 of a power control module 30 (see FIG. 2) and has features that will accept and retain a cover 88 in the event of a replacement operation.

Figure 2:
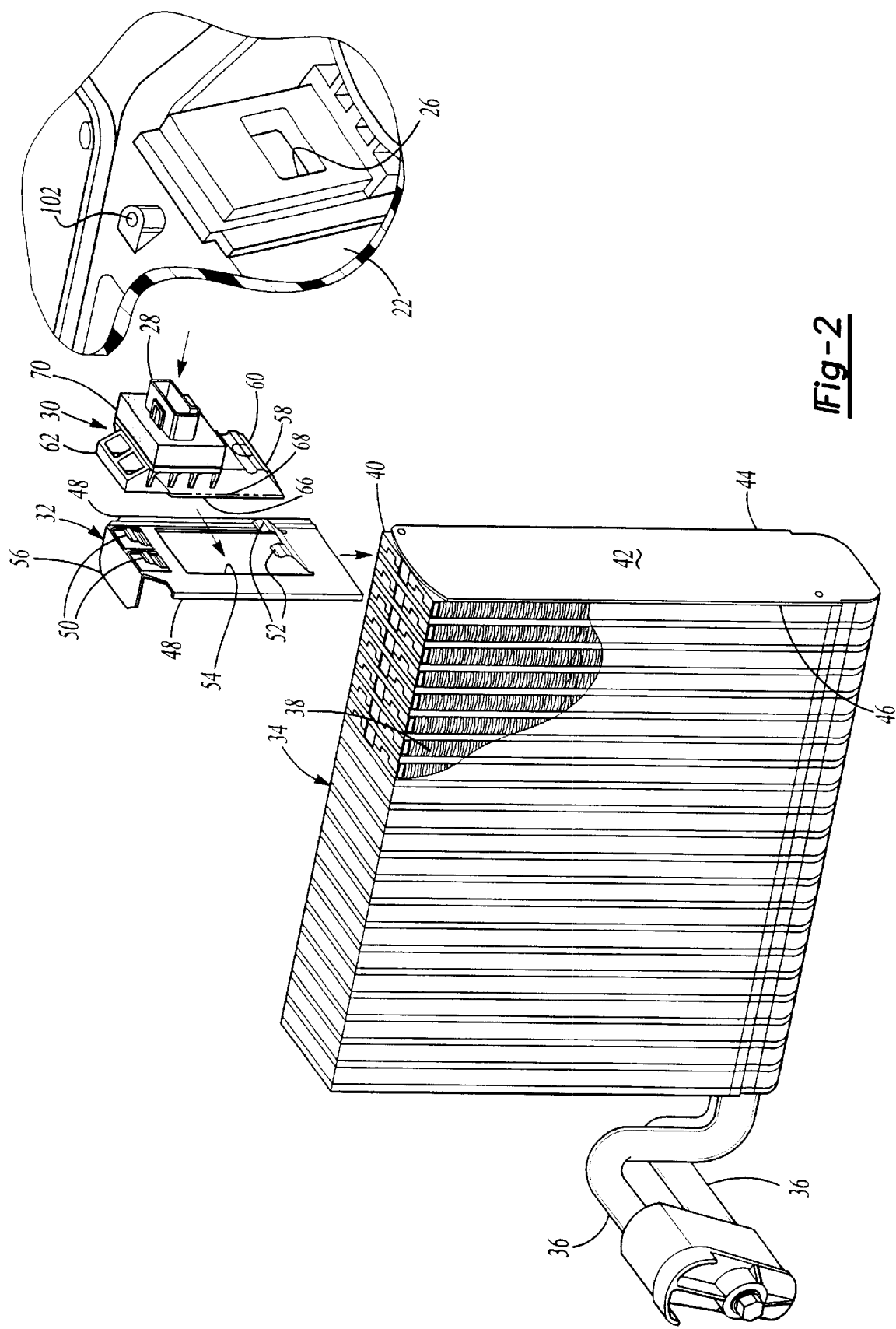
FIG. 2 is a partial exploded view of FIG. 1.

FIG. 2 is a partial exploded view of FIG. 1. Outer housing 22 covers power control module 30, a mounting bracket 32, and an evaporator core 34. Evaporator core 34 is a standard vehicle HVAC evaporator core and includes a plurality of feed lines 36 and a plurality of cooling fins 38. Evaporator core 34 further includes a first end 40, which is covered by a surface 42. Surface 42 includes a first edge 44 opposite a second edge 46. Evaporator core 34 is known in the art.

Figure 4:
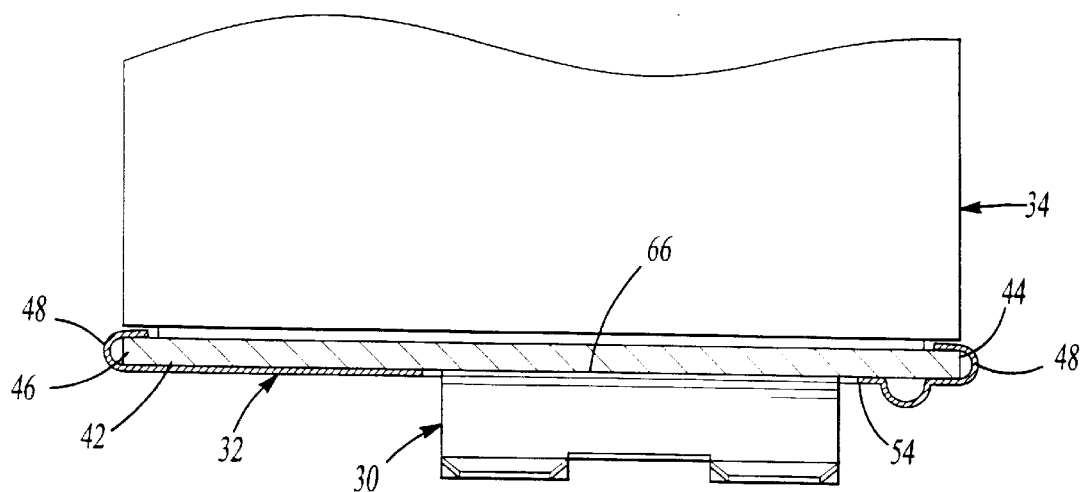
FIG. 4 is a cross-sectional view along Line 4—4 of FIG. 3.

Bracket 32 includes a pair of engaging surfaces 48 preferably in the shape of channels. Bracket 32 further includes a pair of upper retaining clips 50 and a pair of lower retaining clips 52. Mounting bracket 32 further includes a central aperture 54 and a stop 56. Bracket 32 is slidingly received on surface 42 with edges 46 and 44 being received in channels 48. Stop 56 limits the travel of bracket 32 on surface 42. As shown in FIG. 4, engaging surfaces 48, preferably in the shape of channels, receive edges 46 and 44 to retain bracket 32 on surface 42. Because of the environment that bracket 32 will be exposed to it is important that the bracket 32 be capable of withstanding thermal exposure and corrosive material exposure. In one embodiment bracket 32 is designed using SAE 1050 spring steel in any of a number of tempers that provide sufficient heat treating and that include a corrosion resistant coating. Such coatings are known in the art. Although the bracket 32 preferably includes two engaging surfaces 48 in the shape of channels and two pairs of clips 50 and 52, bracket 32 could be designed with only one engaging surface 48 and a single clip.

Power control module 30 includes a housing 58 that surrounds its internal electronics to protect them from moisture and water susceptibility. In one embodiment the housing 58 is formed from plastic. Housing 58 includes a first end 60 that is received in lower retaining clips 52. In one embodiment, first end 60 is especially shaped to contour to an interior contour of lower retaining clips 52. Housing 58 further includes a second end 62 having lips 64 that are received in upper retaining clips 50 (see FIG. 5). Power control module 30 further includes a thermally conductive material 66 that is received in a recess 68 in housing 58. Thermally conductive material 66 includes a first side adjacent to power control module 30 and a second side that is placed against surface 42. Power control module 30 further includes a seal 70 surrounding electrical connection 28 and being aligned with aperture 26 when the HVAC module 20 is assembled. Seal 70 prevents condensate water from inside the HVAC module 20 from leaking out into an interior area of a vehicle.

Thermally conductive material 66 may comprise any material having a high thermal conductivity. Some typical examples include metals such as copper or aluminum. But, thermally conductive material 66 may also comprise thermally conductive non-metallic materials. In one embodiment thermally conductive material 66 comprises a metal plate, preferably an aluminum metal plate. The aluminum metal plate may be anodized-coated for corrosion resistance. Obviously, the size of the thermally conductive material 66 is dependent on the amount of heat that needs to be dissipated, and its thermal conductivity. In one embodiment, the thermally conductive material 66 is a flat anodized-coated aluminum plate having dimensions of approximately 38×55 mm.

Seal 70 may be composed of any resilient sealing material. For example, rubber, foam, elastomeric material, and other sealing materials. To compensate for surface irregularities in surface 42 it may be advantageous to include a layer of thermal grease between surface 42 and thermally conductive material 66. Such thermal greases are well known in the art.

Figure 5:
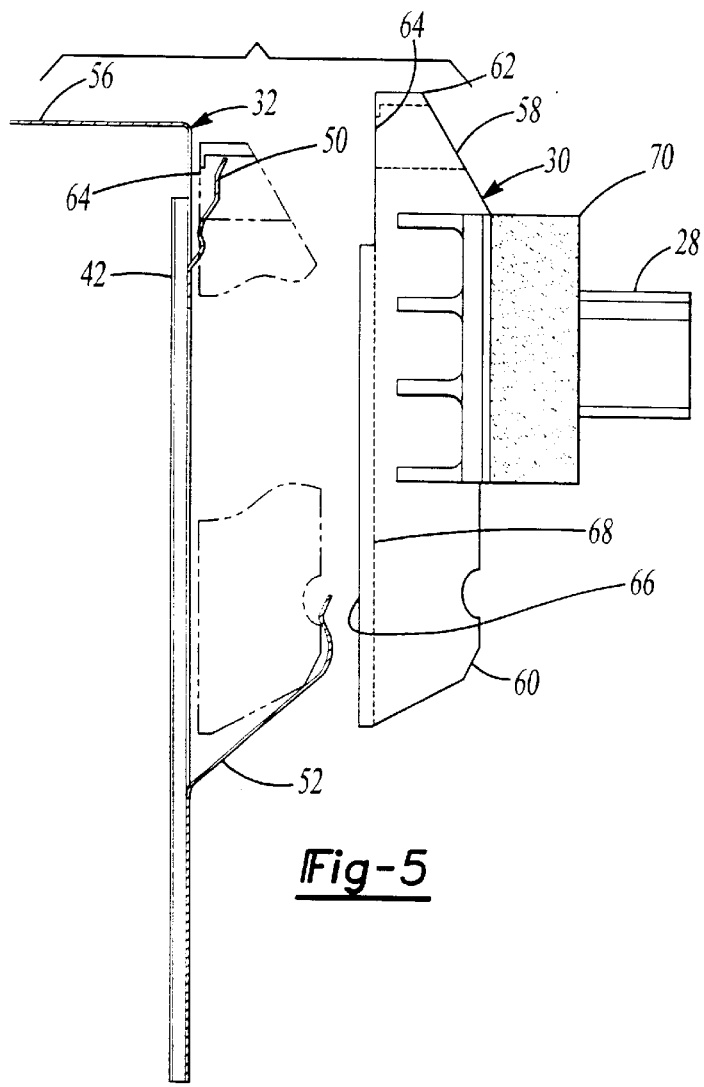
FIG. 5 is a cross-sectional view along Line 5—5 of FIG. 3.

As shown in phantom in FIG. 5, when power control module 30 is received in bracket 32 after bracket 32 is mounted on evaporator core 34 thermally conductive material 66 is tightly pressed against surface 42. This arrangement maximizes transfer of heat from power control module 30 to surface 42. Thus, evaporator core 34 serves as a large heat sink to cool power control module 30.

Electrical connection 28 can be any of the known electrical connections in the art. In one embodiment, electrical connection 28 comprises a plurality of blades and is shaped for receiving a female plug as is known in the art.

Figure 6:
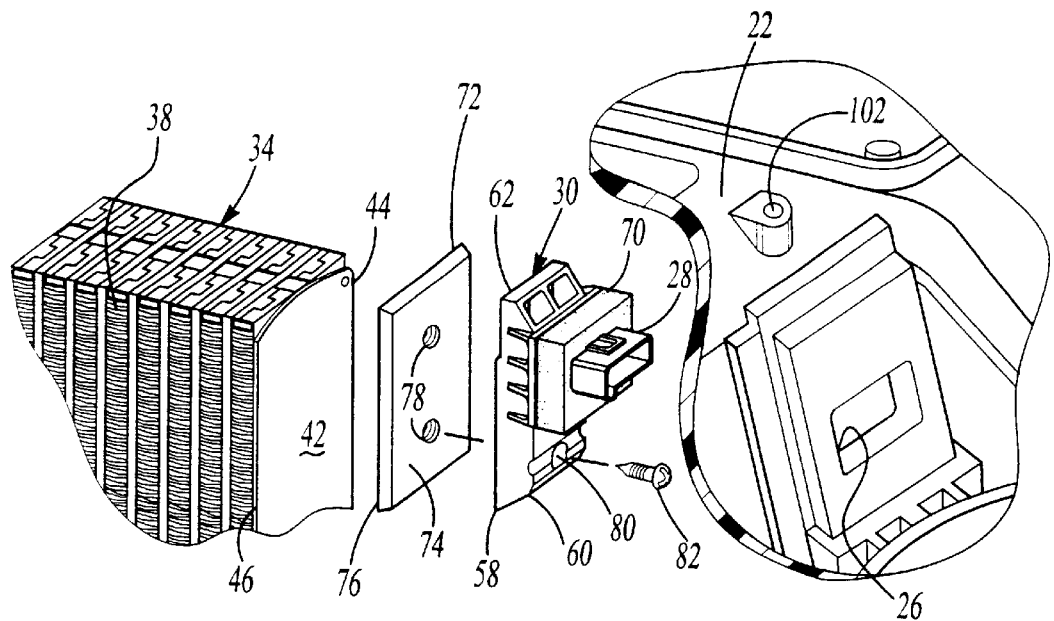
FIG. 6 is a partial exploded view of an alternative embodiment of a heating, ventilation and air conditioning module designed according to the present invention.

FIG. 6 is a partial exploded view of an alternative embodiment of a HVAC module 20 designed in accordance with the present invention. In this embodiment a thermally conductive material in the form of a plate 72 is secured to surface 42 of evaporator core 34. Plate 72 includes a first side 74 and a second side 76. In the assembly of this embodiment second side 76 of plate 72 is first secured to surface 42. Plate 72 can be secured in any of a number of ways; for example, plate 72 can be vacuum brazed to surface 42 during the assembly of evaporator core 34. Alternatively, plate 72 can be initially spot welded to surface 42 and then brazed to surface 42 during the assembly of evaporator core 34 as is known in the art. In one embodiment, plate 72 includes a series of threaded apertures 78. Housing 58 further includes a pair of apertures 80 for receiving fasteners 82. Fasteners 82 are preferably threaded screws that can be inserted through apertures 80 and received in threaded apertures 78 to thereby secure power control module 30 to first side 74 of plate 72. As would be understood by one of ordinary skill in the art, housing 58 could be secured to plate 72 by many other sorts of fasteners. As discussed above, plate 72 may be formed of any thermally conductive material such as, for example, a metallic material or a synthetic material. In a preferred embodiment, plate 72 comprises an aluminum plate.

In FIG. 8 a partial exploded view of an alternative embodiment of power control module 30 is shown. In this embodiment the only change is that electrical connection 28 is replaced by a pigtail connection 84. Such connections are known in the art. Pigtail connection 84 is sealed at power control module 30 and extends for a distance. Pigtail connection 84 includes a seal 86 that functions to seal aperture 26 as does seal 70. In FIG. 8 outer housing 22 is shown with a replacement power control module cover 88 discussed below. Pigtail connection 84 further includes a retaining block 90 to maintain the arrangement of the wires. Preferably, cover 88 includes a clip 92 when combined with a pigtail connection 84 to provide a means for holding pigtail connection 84 adjacent cover 88.

Figure 7:
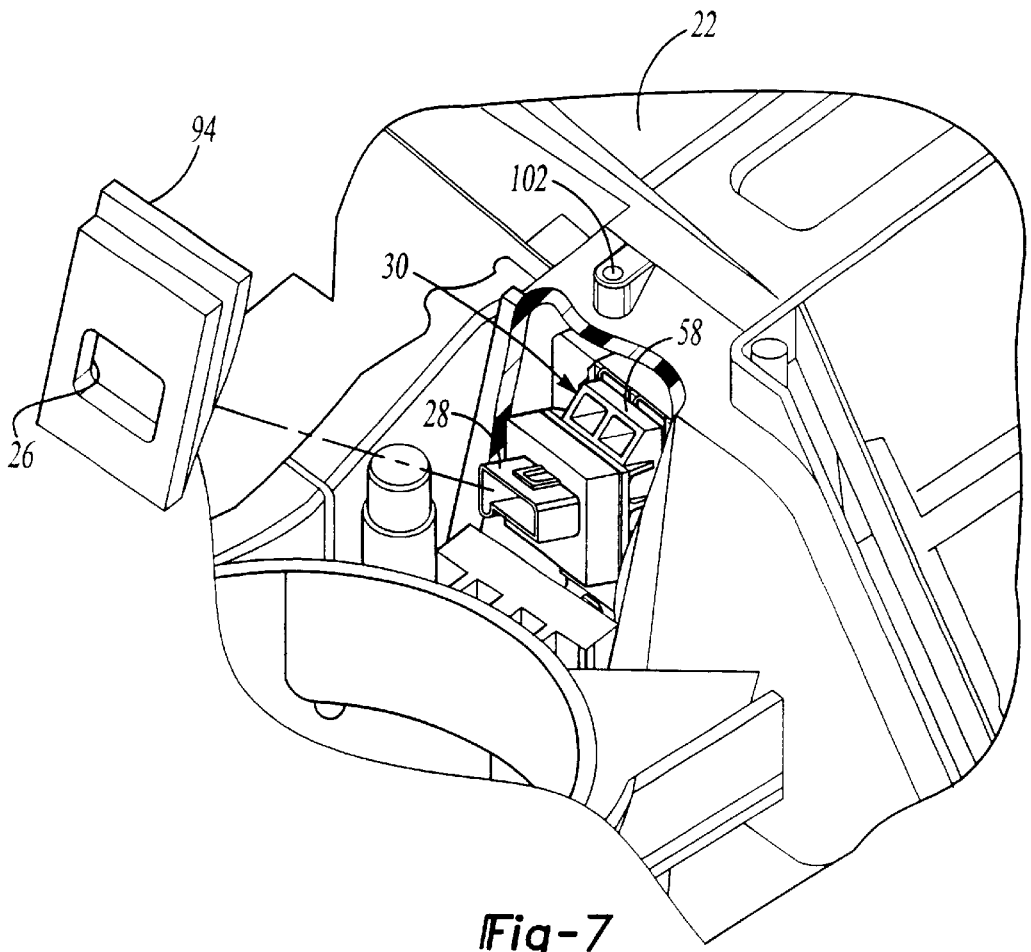
FIG. 7 is a view of FIG. 1 showing the post-installation removal of a portion of an outer housing to expose a power control module.

In the views shown in FIGS. 1, 2, and 6 the HVAC module 20 is shown as it would initially be produced. To enable post-production repair of the power control module 30, it is preferable that HVAC module 20 be provided with a removable portion 94 surrounding aperture 26 as shown in FIG. 7. In one embodiment, removal portion 94 is defined by score lines on outer housing 22. Thus, when it becomes necessary to replace power control module 30 a technician may cut along the score lines and thereby remove removable portion 94 and exposed power control module 30. Following replacement of a power control module 30 the technician would seal outer housing 22 using replacement power control module cover 88 as shown in FIGS. 8 and 9. Cover 88 is sized to fit around the opening left when removable portion 94 is removed. Cover 88 includes an outer seal 96 that surrounds the opening left by removable portion 94 and an aperture 26' for the electrical connection 28 or 84. In one embodiment, cover 88 includes a hole 98 for receiving a fastener 100 that extends through hole 98 into a corresponding hole 102 in outer housing 22. As shown in FIGS. 8 and 9 cover 88 can be used with either electrical connection 28 or pigtail connection 84. Preferably, cover 88 is an injection molded plastic. Preferably outer housing 22 includes a slot 104 for receiving a portion of cover 88.

The foregoing description is exemplary rather than limiting in nature. Variations and modifications to the disclosed embodiment may be come apparent to those skilled in the art and do come within the scope of this invention. Accordingly, the scope of legal protection afforded this invention can only be determined by studying the following claims.

What is claimed is:

1. A power control module comprising:
 a power control module having a housing and an electrical connection;
 a thermally conductive material having a first side in contact with said power control module and a second side in contact with a surface of an evaporator core;
 said thermally conductive material conducting heat from said power control module to said surface of said evaporator core;
 a mounting bracket, said mounting bracket including at least one engaging surface and at least one retaining clip;
 said engaging surface securing said bracket to said surface of said evaporator core;
 said retaining clip engaging said housing of said power control module; and said bracket retaining said power control module and urging said thermally conductive material against said surface of said evaporator core.

2. A power control module as recited in claim 1 wherein said thermally conductive material comprises a thermally conductive metal plate and said housing of said power control module includes a recess for receiving said metal plate.

3. A power control module as recited in claim 2 wherein said thermally conductive metal plate comprises an aluminum plate.

4. A power control module as recited in claim 1 further comprising a thermally conductive grease between said second side of said thermally conductive material and said surface of said evaporator core.

5. A power control module as recited in claim 1 wherein said at least one engaging surface comprises a channel, said channel slidingly receiving an edge of said surface of said evaporator core and said bracket further including a stop, said stop limiting the travel of said edge in said channel.

6. A power control module as recited in claim 1 further comprising a outer housing, said outer housing having a removable portion and an aperture and covering said power control module and at least a portion of said evaporator core, said electrical connection accessible through said aperture.

7. A power control module as recited in claim 6 further including a seal located between said housing of said power control module and said outer housing, said seal aligned around said aperture.

8. A power control module as recited in claim 6 further including a replacement power control module cover;

said power control module cover securable to said outer housing and having an outer seal, said outer seal located between said replacement power control module cover and said outer housing when said cover is secured to said outer housing;

said cover further including an aperture, said electrical connection accessible through said aperture.

9. A power control module as recited in claim 1 wherein said power control module comprises a variable speed blower motor control.

10. A power control module as recited in claim 1 wherein said electrical connection comprises a plurality of electrical terminals.

11. A power control module as recited in claim 1 wherein said electrical connection comprises a pigtail electrical connection.

12. A power control module comprising:

a power control module having a housing and an electrical connection;

a thermally conductive material having a first side connected to said power control module and a second side secured to a surface of an evaporator core;

said thermally conductive material conducting heat from said power control module to said surface of said evaporator core; and an outer housing, said outer housing having an aperture and a removable portion and covering said power control module and at least a portion of said evaporator core, said electrical connection accessible through said aperture.

13. A power control module as recited in claim 12 wherein said thermally conductive material comprises a thermally conductive metal plate, and said power control module includes at least one fastener for securing said power control module to said metal plate.

14. A power control module as recited in claim 13 wherein said thermally conductive metal plate comprises an aluminum plate.

15. A power control module as recited in claim 13 wherein said second side of said thermally conductive metal plate is secured to said surface of said evaporator core by brazing, welding, or a combination of both brazing and welding.

16. A power control module as recited in claim 12 further including a seal located between said housing of said power control module and said outer housing, said seal aligned around said aperture.

17. A power control module as recited in claim 12 further including a replacement power control module cover;

said power control module cover securable to said outer housing and having an outer seal, said outer seal located between said replacement power control module cover and said outer housing when said cover is secured to said outer housing;

said cover further including an aperture, said electrical connection accessible through said aperture.

18. A power control module as recited in claim 12 wherein said power control module comprises a variable speed blower motor control.

19. A method for cooling a power control module comprising the steps of:

a) providing a power control module having a housing and an electrical connection;

b) providing a surface of an evaporator core;

c) positioning a first side of a thermally conductive material against the power control module and positioning a second side of the thermally conductive material against the surface of the evaporator core;

d) conducting heat from the power control module through the thermally conductive material to the surface of the evaporator core;

e) providing a mounting bracket and securing the mounting bracket to the evaporator core;

f) securing the power control module to the mounting bracket; and g) shaping the mounting bracket to urge the thermally conductive material against the surface of the evaporator core when the mounting bracket is secured to the evaporator core and the power control module is secured to the mounting bracket.

20. A method as recited in claim 19 wherein step c) further comprises positioning a first side of a thermally conductive metal plate against the power control module and positioning a second side of the thermally conductive metal plate against the surface of the evaporator core.

21. A method as recited in claim 20 wherein step c) further comprises positioning a first side of an aluminum plate against the power control module and positioning a second side of the aluminum plate against the surface of the evaporator core.

22. A method as recited in claim 19 wherein step c) further comprises placing a thermally conductive grease between the second side of the thermally conductive material and the surface of the evaporator core.

23. A method as recited in claim 19 further comprising the steps of:

providing a mounting bracket having at least one channel and at least one retaining clip;

sliding the at least one channel over an edge of the surface of the evaporator core to secure the mounting bracket to the evaporator core; and positioning the at least one retaining clip over a portion of the housing of the power control module to secure the power control module to the mounting bracket, and the at least one retaining clip urging the thermally conductive material against the surface of the evaporator core.

24. A method as recited in claim 19 comprising the further steps of providing an outer housing having an aperture and a removable portion and covering the power control module and at least a portion of the evaporator core with the outer housing, the aperture permitting access to the electrical connection; and positioning a seal between the housing of the power control module and the outer housing and aligning the seal around the aperture.

25. A method as recited in claim 24 comprising the further steps of:

removing a portion of the outer housing to expose the power control module;

providing a replacement power control module cover having an outer seal and an aperture; and securing the replacement power control module cover to the outer housing with the aperture aligned with the electrical connection and the outer seal positioned between the cover and the outer housing.

26. A method as recited in claim 19 wherein step c) further comprises securing the second side of the thermally conductive material to the surface of the evaporator core by brazing, welding, or both brazing and welding the second side to the surface.

* * * * *